US 6,437,445 B1

(12) United States Patent
Lee et al.

(10) Patent No.: US 6,437,445 B1
(45) Date of Patent: Aug. 20, 2002

(54) NIOBIUM-NEAR NOBLE METAL CONTACT STRUCTURES FOR INTEGRATED CIRCUITS

(75) Inventors: Chong-Mu Lee; Young-Jae Kwon; Dae-Lok Bae; Young-Wug Kim, all of Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/670,171

(22) Filed: Sep. 26, 2000

Related U.S. Application Data (62) Division of application No. 09/183,081, filed on Oct. 30, 1998, now Pat. No. 6,150,249.

(30) Foreign Application Priority Data

Oct. 30, 1997 (KR) ............................ 97-56565

(51) Int. Cl.[7] ..................... H01L 23/48; H01L 23/52; H01L 25/40
(52) U.S. Cl. ........................ 257/768; 257/757
(58) Field of Search ..................... 257/757, 758, 257/766, 768; 438/592, 682, 683

(56) References Cited

U.S. PATENT DOCUMENTS

| | | | |
|---|---|---|---|
| 4,800,177 A | * 1/1989 | Nakame | 437/193 |
| 5,162,255 A | * 11/1992 | Ito et al. | 437/89 |
| 5,449,642 A | 9/1995 | Tan et al. | 437/200 |
| 5,624,869 A | 4/1997 | Agnello et al. | 438/602 |
| 5,668,040 A | * 9/1997 | Bryun | 438/396 |
| 5,780,349 A | 7/1998 | Naem | 438/305 |
| 5,989,988 A | * 11/1999 | Iinuma et al. | 438/592 |

OTHER PUBLICATIONS

Matsubara et al., "Activation Energy for the C49–to–C54 Phase Transition of Polycrystalline $TiSi_2$ Films With Under 30nm Thickness", Mat. Res. Soc. Symp. Proc., vol. 311, 1993, pp. 263–268.

Maex et al., "Degradation of Doped Si Region Contacted With Transition–Metal Silicides Due to Metal–Dopant Compound Formation", J. Appl. Phys., vol. 66, No. 11, Dec. 1, 1989, pp. 5327–5334.

Broadbent et al., "Application of Self–Aligned $CoSi_2$ Interconnection in Sub–Micron CMOS Transistors", V–MIC Conf. Jul. 13–14, 1988, pp. 175–182.

Wolf et al., "Refractory Metals and Their Silicides in VLSI Fabrication", Ch. 11, Silicon Processing for the VLSI Era, vol. 1: Process Technology, Lattice Press, 1986, pp. 384–406.

* cited by examiner

*Primary Examiner*—Richard Elms
*Assistant Examiner*—Brad Smith
(74) *Attorney, Agent, or Firm*—le;.5qMyers Bigel Sibley & Sajovec

(57) ABSTRACT

Integrated circuit contact structures are fabricated by forming a first layer comprising niobium (Nb) on a silicon substrate and forming a second layer comprising a near noble metal on the first layer, opposite the silicon substrate. The near noble metal, also referred to as a Group VIII metal, is preferably cobalt (Co). The near noble metal has higher diffusion coefficient than the niobium and the silicon substrate. Annealing is then performed to diffuse at least some of the near noble metal through the first layer and react the diffused near noble metal with the silicon substrate to form a third layer comprising a near noble metal silicide, and to form a fourth layer comprising niobium-near noble metal alloy on the third layer. It has been found that the use of niobium can reduce substrate consumption compared to conventional cobalt titanium double-metal silicide fabrication processes. The annealing step is preferably performed in a nitrogen containing ambient to also form a fifth layer comprising niobium nitride on the fourth layer, opposite the third layer. Moreover, when a native oxide layer is included on the silicon substrate, the annealing step can react the niobium with the native oxide and thereby remove the native oxide layer.

8 Claims, 7 Drawing Sheets

(Prior Art)

NIOBIUM-NEAR NOBLE METAL CONTACT STRUCTURES FOR INTEGRATED CIRCUITS

CROSS REFERENCE TO RELATED APPLICATION

This application is a divisional of application Ser. No. 09/183,081, filed Oct. 30, 1998, entitled Methods of Forming Niobium-Near Noble Metal Contact Structures for Integrated Circuits, now U.S. Pat. No. 6,150,249, and claims the benefit of Korean Patent Application No. 97-56565, filed Oct. 30, 1997, assigned to the assignee of the present invention, the disclosures of both of which are hereby incorporated herein by reference in their entirety as if set forth fully herein.

FIELD OF THE INVENTION

This invention relates to integrated circuits and fabrication methods therefor, and more particularly to contact structures for integrated circuits and fabrication methods therefor.

BACKGROUND OF THE INVENTION

Metal silicide contacts are widely used in integrated circuits for low resistivity contacts. Moreover, self-aligned silicide or salicide technology is widely used to form low resistance source, drain and gate contacts for integrated circuit field effect transistors. In a salicide process, metal is deposited over an integrated circuit field effect transistor and reacted with the exposed silicon areas of the source and drain as well as the exposed polysilicon gate electrode, to form a silicide. Metal silicide and salicide technology are described in Chapter 11 of the textbook entitled *Silicon Processing for the VLSI Era, Volume I: Process Technology* by Wolfe and Tauber, 1986, pages 384–406, the disclosure of which is hereby incorporated herein by reference.

When used in highly integrated field effect transistors, the silicide structure can produce low contact resistance with the source and drain regions and low sheet resistance in the bulk source/drain regions. These low resistances can reduce parasitic series resistance, shorten delay times and improve operational speed.

Integrated circuit fabrication has emphasized titanium silicide ($TiSi_2$) and cobalt silicide ($CoSi_2$) for silicide structures. In particular, titanium silicide exhibits low resistivity, strong tolerance to hot carrier degradation and stable silicidation. Unfortunately, shorts between the gate and source/drain electrodes can occur due to reaction between titanium (Ti) and the gate oxide sidewall spacer during silicide formation. Moreover, the contact resistance between titanium silicide and platinum may increase at temperatures over 800° C. Titanium is therefore preferably annealed to form silicide in an oxygen-free ambient to reduce oxidation thereof. Titanium also may be susceptible to electromigration, and defects can occur in edge portions of titanium disilicide due to stress. Finally, if more than 700 Å of titanium silicide is formed on shallow source/drain junctions of less 0.21 $\mu$m, the silicon substrate can be overconsumed thereby increasing leakage current and contact resistance.

On the other hand, cobalt silicide has a low resistivity of between about 16 and 18 $\mu\Omega$-cm and is stable at high temperatures. Moreover, cobalt (Co) can reduce short circuits between the gate and the source/drain electrodes. Cobalt silicide can form a relatively smooth contact with silicon compared to titanium silicide, without unduly disturbing the source/drain regions. See the publication entitled *Degradation of Doped Si Regions Contacted with Transition-Metal Silicides Due to Metal-Dopant Compound Formation* to Maex et al., Journal of Applied Physics, Vol. 66, No. 11, pages 5327–5334, 1989. Cobalt silicide may be less sensitive to plasma etching compared to titanium silicide and may exhibit less stress. Finally, competitive reactions other than silicide reactions may not occur in cobalt sicilide, unlike titanium sicilide which can form titanium nitride as a byproduct of the silicide forming reaction.

Unfortunately, cobalt silicide may have its own problems. First, it may be difficult to form a silicide layer having the proper thickness on the gate and on the source/drain regions in one step. This is because the gate may use a thick silicide layer to reduce wiring resistance and the source and drain regions may use a thin silicide layer so as to prevent overconsumption of the silicon wafer. To solve this problem, a method is proposed in a publication entitled *Activation Energy for the C49-to-C54 Phase Transition of Polycrystalline $TiSi_2$ Films with Under 30 nm Thickness* to Matsubara et al., Materials Research Society Symposium Proceedings, Vol. 311, pages 263–268, 1993. Disclosed is a two-step process that forms a thick silicide layer on the gate and a thin silicide layer on the source/drain.

Moreover, silicidation may not occur uniformly because the cobalt silicide may not remove the native oxide on the silicon wafer. A rough interface may thereby be formed which can increase the thermal resistance, the contact resistance and the leakage current. In order to remove the native oxide layer the silicon substrate may be dipped in diluted hydrofluoric acid or sputter etched before forming the silicide.

Finally, at temperatures above 400° C. the cobalt silicide may react with an aluminum conductive line so that diffusion barriers may need to be formed between the cobalt silicide and the aluminum to allow high temperature annealing. See the publication entitled *Application of Self-Aligned $CoSi_2$ Interconnection in Sub-Micron CMOS Transistors* by Broadbent et al., Proceedings of the IEEE V-MIC Conference, Pages 175–182, 1988.

Methods have been developed which use cobalt/refractory metal double-metal layers. The use of a cobalt/refractory metal double-metal layer can provide a smooth interface with the silicon substrate and can reduce overconsumption of the silicon by controlling the silicidation reaction. Moreover, a diffusion barrier layer can be formed on the silicide layer by controlling the annealing ambient. As is well known to those having skill in the art, the refractory metals include titanium (Ti), zirconium (Zr), vanadium (V), hafnium (Hf), niobium (Nb) and tantalum (Ta).

Methods of forming cobalt/refractory metal double-metal layers will now be described. First, a thin refractory metal layer is formed on a silicon substrate. Then, a thin cobalt layer is formed thereon thereby forming a cobalt/refractory double-metal layer. A rapid thermal anneal is conducted on the double-metal layer in a nitrogen ambient. The silicidation temperature of the cobalt/refractory double-metal layer is higher than that of the cobalt layer so that cobalt is the main diffusion source during cobalt silicide formation. The diffusion coefficient of the cobalt is also greater than that of the refractory metal and silicon. Therefore the position of the refractory metal and the cobalt become reversed to produce a "layer inversion" phenomenon. Stated differently, the cobalt diffuses downward and the refractory metal diffuses upward.

Moreover, because the refractory metal exhibits a high oxidation ratio compared with the silicon, the refractory metal also removes the native oxide layer, thereby cleaning the silicon wafer. Then, the cobalt diffuses through the refractory metal layer and reacts with the silicon wafer to thereby form cobalt silicide. The refractory layer limits diffusion of the cobalt, thereby reducing breakdown of the shallow junction. Also, a nitride layer is formed on the cobalt silicide during annealing. The nitride layer can serve as a diffusion barrier layer and can prevent agglomeration of the silicide layer.

In order to form the cobalt/refractory metal double-metal layer, the silicidation is preferably performed by thermally annealing. Thus, the refractory metal should have a high oxidation rate compared with the silicon wafer. The silicidation temperature of the refractory metal should also be high compared with cobalt, thereby causing the layer inversion phenomenon. Also, the main diffusion source should be the silicon and not the refractory metal, so as to prevent reverse diffusion of the refractory metal into the silicon wafer during the annealing. Finally, the diffusion coefficient of the cobalt in the refractory metal should be large to thereby allow layer inversion to take place.

Of the refractory metals, titanium, zirconium, vanadium, hafnium, niobium and tantalum may possess the above characteristics. Titanium is generally used as the refractory metal in the cobalt/refractory metal double-metal layer process. Titanium can be easily oxidized so that the native oxide layer can be removed to thereby form an epitaxial silicide layer. The titanium also reacts readily with the cobalt, to thereby allow a complete layer inversion. Accordingly, sheet resistance can be low and the titanium nitride layer is formed on the cobalt silicide layer.

Unfortunately, when using titanium as a refractory metal, an undesirable reaction that consumes the silicon wafer can occur. This wafer consumption can degrade the shallow source and drain regions thereby increasing leakage current.

FIGS. 1A–1E graphically illustrate X-Ray Diffraction (XRD) spectra for a conventional cobalt/titanium double-metal layer process. A 120 Å thick titanium layer and 250 Å thick cobalt layer are used. Annealing is performed for 30 seconds at temperatures of 900° C., 800° C., 700° C., 600° C. and no rapid thermal annealing in FIGS. 1A–1E, respectively.

As shown in FIGS. 1A–1E, the XRD spectra show stable phase cobalt silicide at each annealing temperature. However, especially in FIG. 1D, a cobalt-titanium-silicon peak is detected. This indicates that additional undesirable reaction is taking place that consumes the silicon wafer during the annealing process. As a result, the silicon wafer may be overconsumed thereby degrading the device characteristics. Moreover, if the thickness of the cobalt/titanium double-metal structure is increased, some titanium may remain on the silicon wafer as β-titanium. This may undesirably form titanium silicide or cobalt-titanium-silicide alloy on the silicide layer.

Accordingly, there continues to be a need for improved double-metal layer silicide and salicide processes and structures.

SUMMARY OF THE INVENTION

It is therefore an object of the present invention to provide methods of forming silicide layers for integrated circuits and salicide methods for forming source, drain and gate contacts for integrated circuit field effect transistors.

It is another object of the invention to provide improved metal silicide integrated circuit contact structures including field effect transistor source, drain and gate contact structures.

It is still another object of the present invention to provide double-metal silicide structures and double-metal salicide processes that can reduce consumption of the silicon wafer compared to conventional cobalt/titanium double-metal silicide structures and salicide processes.

These and other objects are provided according to the present invention by forming a first layer comprising niobium (Nb) on a silicon substrate and forming a second layer comprising a near noble metal on the first layer, opposite the silicon substrate. The near noble metal, also referred to as a Group VIII metal, is preferably cobalt (Co). The near noble metal has higher diffusion coefficient than the niobium and the silicon substrate. Annealing is then performed to diffuse at least some of the near noble metal through the first layer and react the diffused near noble metal with the silicon substrate to form a third layer comprising a near noble metal silicide, and to form a fourth layer comprising niobium-near noble metal alloy on the third layer. It has been found that the use of niobium can reduce substrate consumption compared to conventional cobalt titanium double-metal silicide fabrication processes.

The annealing step is preferably performed in a nitrogen containing ambient to also form a fifth layer comprising niobium nitride on the fourth layer, opposite the third layer. Moreover, when a native oxide layer is included on the silicon substrate, the annealing step can react the niobium with the native oxide and thereby remove the native oxide layer.

The above described methods can be used to form source, drain and gate contacts for integrated circuit field effect transistors including spaced apart source and drain regions in a silicon semiconductor substrate and an insulated polysilicon gate electrode on the silicon semiconductor substrate, between the spaced apart source and drain regions. A first layer comprising niobium is formed on the source and drain regions and on the polysilicon gate electrode. A second layer comprising a near noble metal is formed on the first layer, opposite the silicon substrate. The near noble metal has higher diffusion coefficient than niobium and the silicon substrate.

Annealing is performed to diffuse at least some of the near noble metal through the first layer and react the diffused near noble metal with the silicon and polysilicon to form a third layer comprising a near noble metal silicide on the source and drain regions and on the polysilicon gate electrode, and to form a fourth layer comprising niobium-near metal alloy on the third layer. The annealing may take place in nitrogen to also form a fifth layer comprising niobium nitride on the fourth layer, opposite the third layer. The annealing can also react the niobium with the native oxide to thereby remove the native oxide layer.

Integrated circuit contact structures according to the invention include a first layer comprising a near noble metal silicide on a silicon substrate and a second layer comprising niobium-near noble metal alloy on the first layer opposite the silicon substrate. A third layer comprising niobium nitride may also be provided on the second layer, opposite the first layer. The near noble metal is preferably cobalt and the structure is preferably free of the native oxide layer between the silicon substrate and the first layer. This contact structure may also be provided on the source and drain regions and on the polysilicon gate electrode of an integrated circuited field effect transistor. Improved silicides and salicide processes and structures may thereby be provided.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

FIGS. 2A–2E graphically illustrate XRD spectra of cobalt/niobium double metal layer structures according to the present invention. The structures of FIGS. 2A–2E use 120 Å thick niobium and 180 Å thick cobalt layers that are annealed for 30 seconds at temperatures of 900° C., 800° C., 700° C., 600° C. and no rapid thermal annealing, respectively.

As shown in FIGS. 2A–2E, niobium silicide and cobalt-niobium-silicide peaks, corresponding to the titanium silicide and cobalt-titanium-silicide peaks in FIGS. 1A–1E, are not present. In other words, an undesirable reaction which consumes the semiconductor substrate beyond the cobalt silicide forming silicidation reaction does not appear to be taking place. Thus, consumption of the substrate can be reduced and preferably minimized. As also shown, the near stable phase CoSi and $Co_2Si$ may be changed to $CoSi_2$ in subsequent high thermal treatment.

Figure 1A:
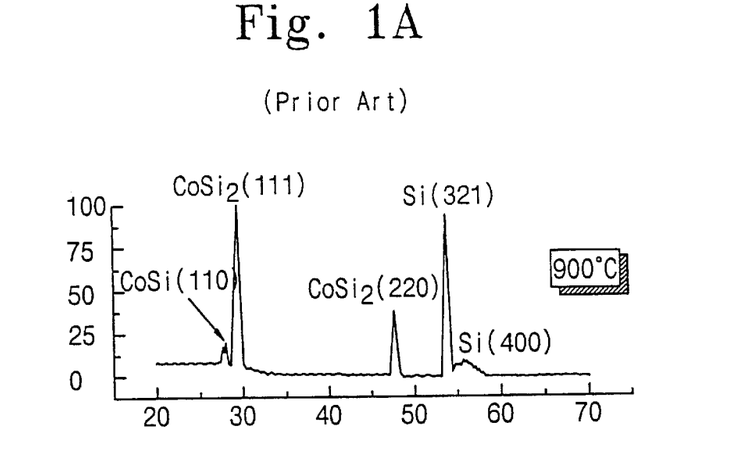
FIGS. 1A–1E represent X-Ray Diffraction (XRD) spectra of structures fabricated using conventional cobalt/titanium double metal layer processes.
Figure 1B:
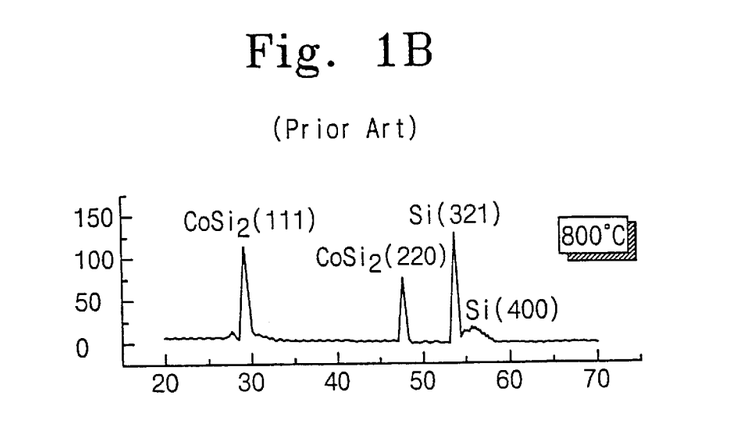
Figure 1C:
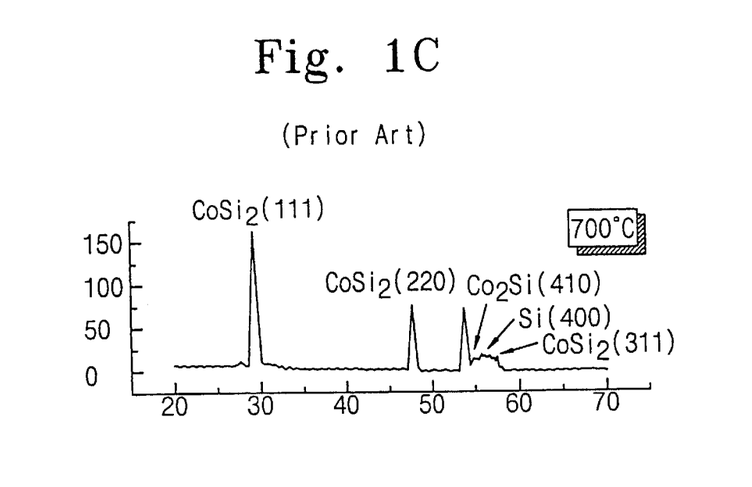
Figure 1D:
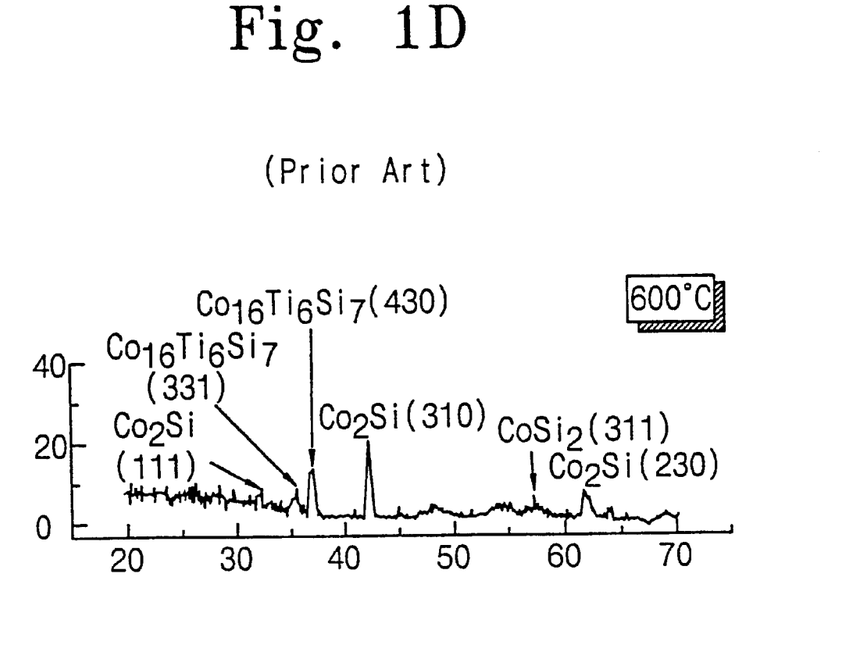
Figure 1E:
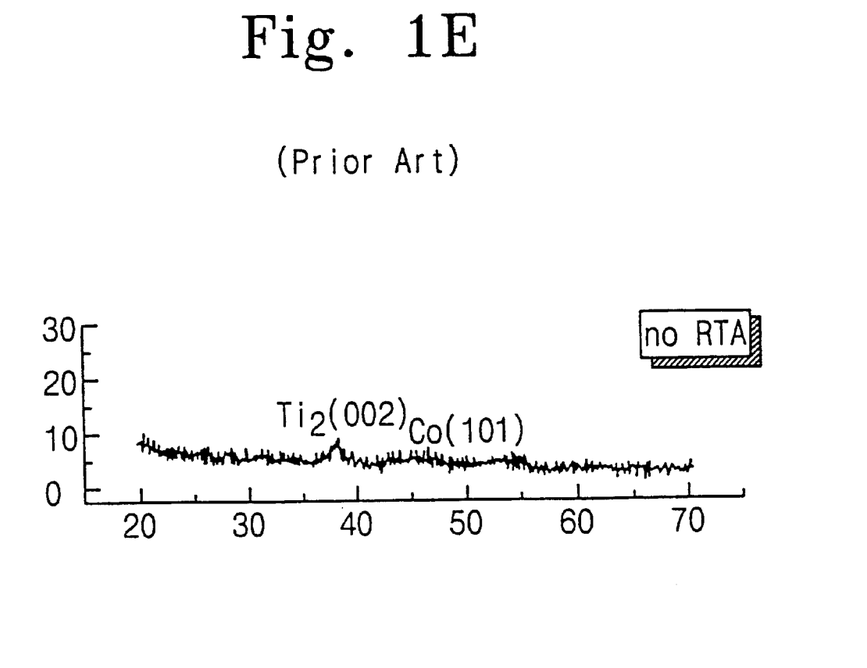
Figure 2A:
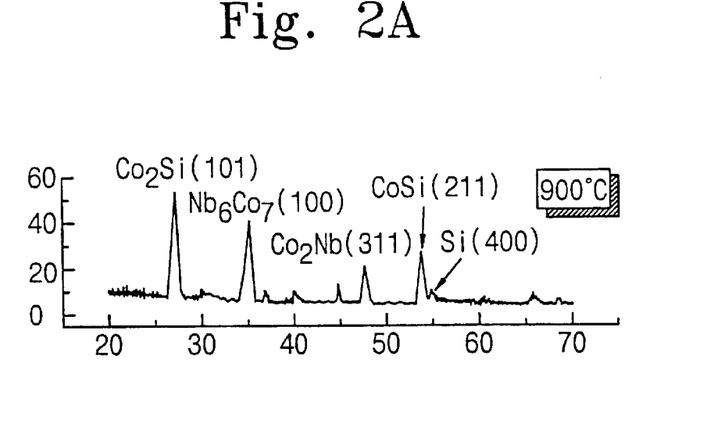
FIGS. 2A–2E represent XRD spectra of cobalt/niobium double metal layer structures according to the present invention.
Figure 2B:
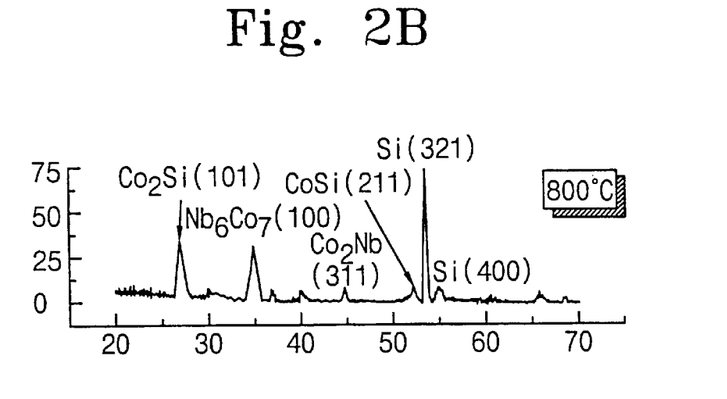
Figure 2C:
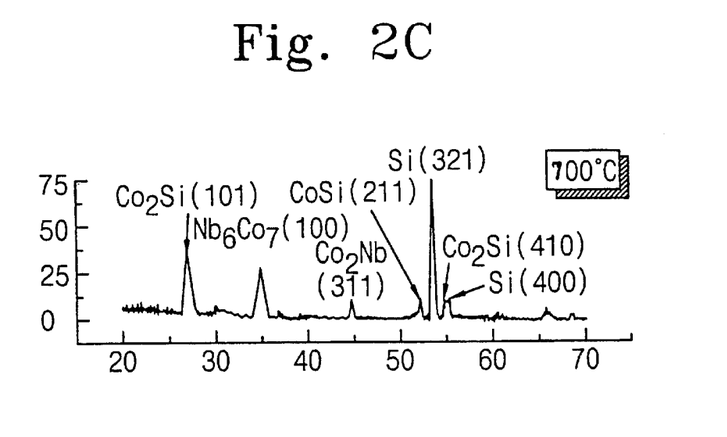
Figure 2D:
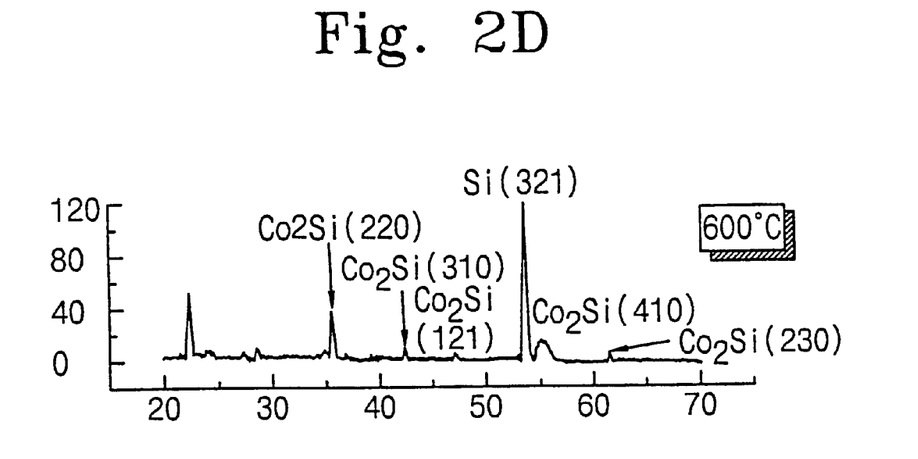
Figure 2E:
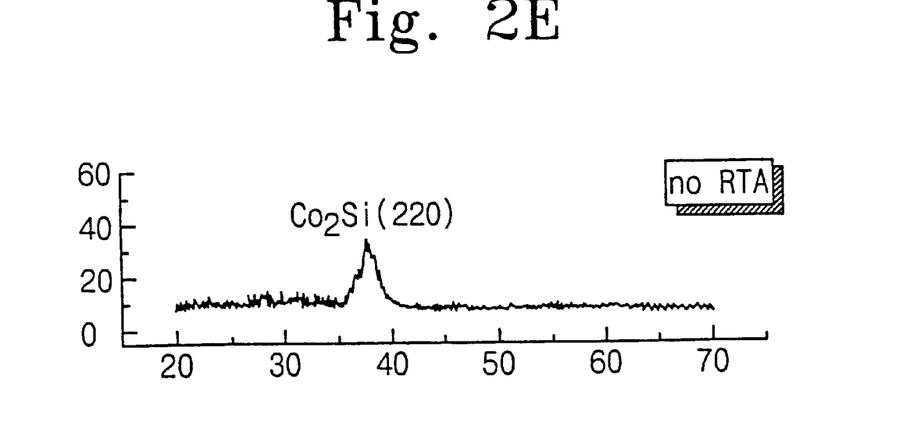
Figure 3:
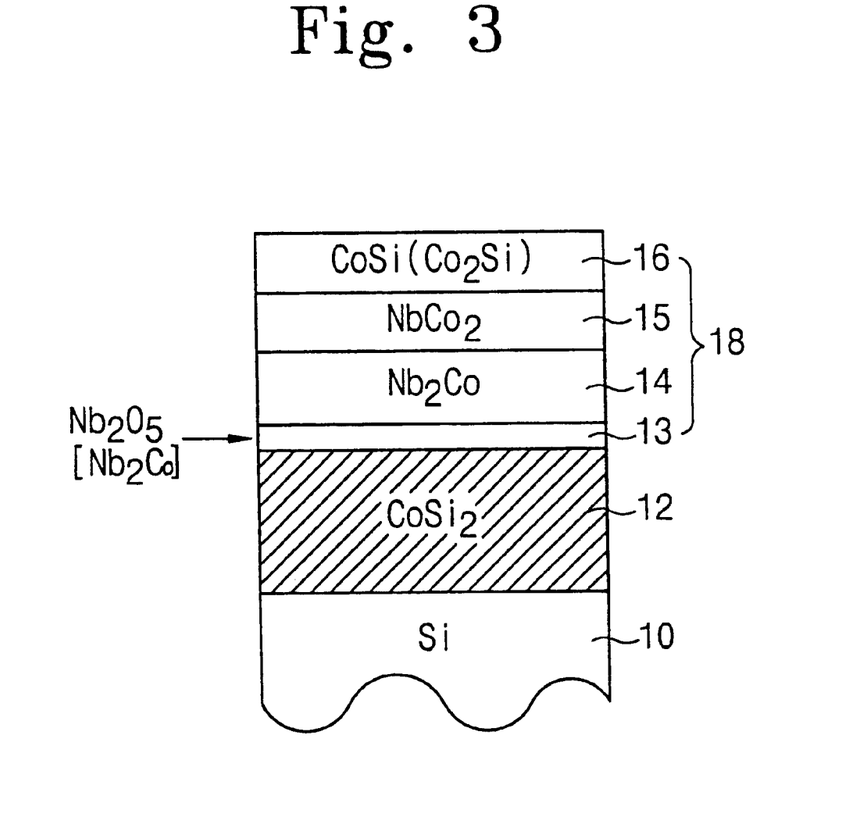
FIG. 3 is a cross-sectional view of a silicide structure, the spectrum of which is illustrated in FIG. 2B.

FIG. 3 is a cross-sectional view of a silicide structure that may be formed by forming a 180 Å thick cobalt layer and a 120 Å thick niobium layer on a silicon substrate and then annealing at 800° C. for 30 seconds. The silicide structure includes a silicon substrate 10, a first layer comprising a near noble metal silicide such as an epitaxial cobalt silicide layer 12 on the silicon substrate 10 and a second layer 18 comprising niobium-near noble metal alloy on the first layer 12. The second layer 18 includes an $Nb_2O_5[Nb_2Co]$ layer 13, an $Nb_2Co$ layer 14, an $Nb_2Co_2$ layer 15 and a CoSi ($Co_2Si$) layer 16. Since the formation heat of the $NbSi_2$ ($\Delta H_{f,NbSi2}$=–10.7 cal/mole) is not lower than that of $Co_2Si$ ($\Delta H_f$=–9.2 kal/mole), CoSi($\Delta H_f$=–12.0 kal/mole), and $CoSi_2$($\Delta H_f$=–8.2 kal/mole), the likelihood of $NbSi_2$ formation is very high when niobium contacts the semiconductor substrate.

However, in the early stage of the silicidation reaction, while the silicon does not diffuse into the cobalt silicide and the niobium layers due to its low diffusion rate with the cobalt silicide and the niobium layers, the cobalt diffuses through the niobium layer and reacts with the semiconductor substrate to form the cobalt silicide layer 12 due to its relatively high diffusion rate within the niobium layer compared with the silicon. Upon forming the cobalt silicide layer, there is little if any niobium silicide formation.

Figure 4A:
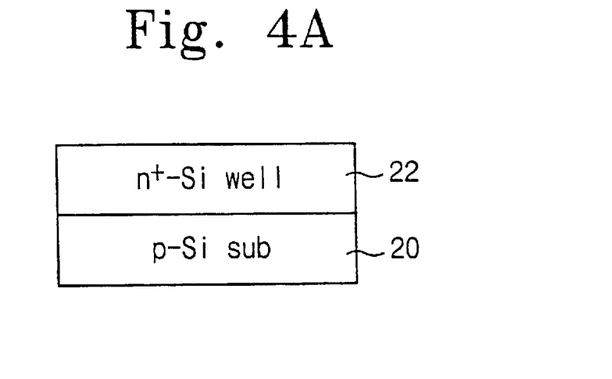
FIGS. 4A–4C are cross sectional views illustrating methods for forming silicides according to the present invention.
Figure 4B:
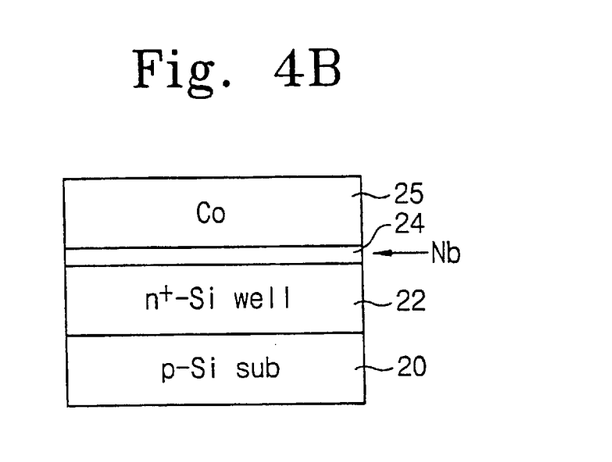
Figure 4C:
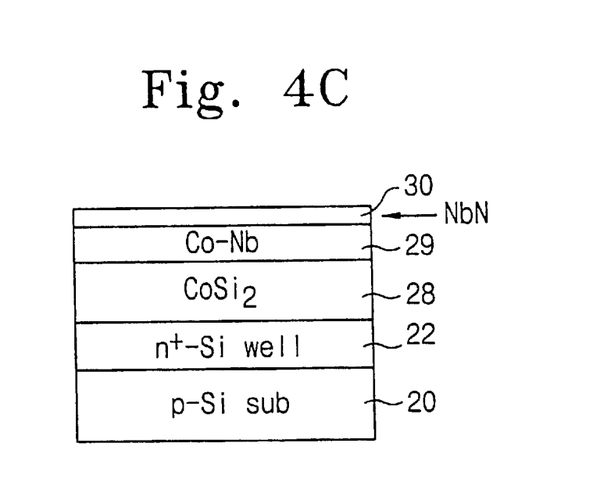

FIGS. 4A–4C are cross-sectional views of methods of forming silicide layers for integrated circuits according to the present invention. As shown in FIG. 4A, a p-type substrate 20 includes an n+well region 22 thereon. In particular, p-type dopants such as boron are implanted into the semiconductor substrate 20 and then driven, for example at 1150° C. for 780 minutes, to thereby form the p-type silicon substrate 20. A thermal oxide layer may be formed on the p-type semiconductor substrate 20. Then, n-type impurity ions such as arsenic are implanted into the thermal oxide layer. An annealing process is then performed, for example in nitrogen at 850° C. for three minutes, to thereby form the $n^+$ well region 22.

Referring now to FIG. 4B, a first layer comprising niobium 24 and a second layer comprising a near noble metal such as cobalt 25 are sequentially formed on the silicon substrate. The double metal layer may be formed using electron beam evaporation, sputtering or other conventional techniques. As is well known to those having skill in the art, the near noble metals, also referred to as Group VIII metals, include Fe, Co, Ni, Ru, Rh, Pd, Os, Ir and Pt. Preferably, the first layer comprising niobium 24 has a thickness of about 100 Å and the second layer comprising cobalt 25 has a thickness of about 200 Å.

Referring now to FIG. 4C, rapid thermal annealing may then be conducted to thereby form a third layer comprising near noble metal silicide such as cobalt silicide 28 and to form a fourth layer comprising niobium-near noble metal alloy such as cobalt niobium alloy 29 on the third layer 28. Annealing may take place in a nitrogen ambient of about $10^{-5}$ torr or less, at about 900° C. for about 30 seconds.

The silicidation temperature of the niobium and cobalt double metal layer is higher than that of the cobalt layer 25. Thus, cobalt is the main diffusion source during formation of the cobalt silicide layer 28. Moreover, the diffusion coefficient of the cobalt is greater than that of the niobium and the silicon. Therefore, the positions of the niobium containing layer 24 and the cobalt containing layer 25 of FIG. 4B are reversed, so that layer inversion occurs. Stated differently, the cobalt diffuses downward and the niobium diffuses upward.

Moreover, because the niobium exhibits a high oxidation ratio compared with silicon, the niobium-containing layer 24 can remove the native oxide from the silicon substrate. After removal of the native oxide layer, the niobium diffuses upward through the cobalt to the surface. The cobalt diffuses through the niobium and reacts with the semiconductor substrate to thereby form cobalt silicide containing layer 28. The niobium layer 24 limits the diffusion of the cobalt, thereby reducing and preferably minimizing the consumption of the semiconductor substrate during formation of the cobalt silicide layer 28.

Because the semiconductor substrate has been cleaned of native oxide, the cobalt silicide layer may be of high quality. In particular, low defect epitaxial cobalt silicide may be formed. Finally, the niobium which has diffused to the outer surface of the structure reacts with the nitrogen ambient to form a fifth layer comprising niobium nitride 30 on the fourth layer. The niobium nitride layer can serve as a diffusion barrier layer between the cobalt silicide layer 28 and an upper metal line that is formed thereon during subsequent processing.

Figure 5:
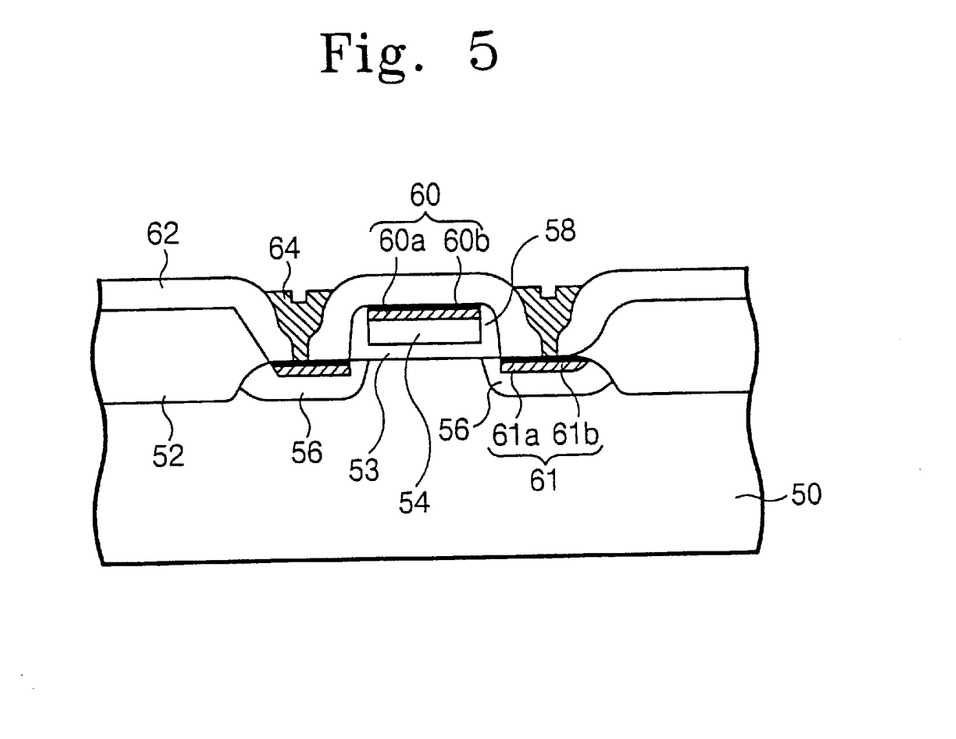
FIG. 5 is a cross section of a field effect transistor according to the present invention.

FIG. 5 illustrates an integrated circuit field effect transistor including self-aligned silicide contacts. As shown, a silicon substrate 50 includes conventional field isolation regions 52, a gate oxide layer 53, a gate electrode 54, spaced apart source and drain regions 56, a gate sidewall spacer 58, double metal layers 60 and 61, an interlayer insulating film 62 and source/drain electrodes 64.

In order to form source, drain and gate contacts for an integrated circuit field effect transistor of FIG. 5, the first layer comprising niobium is formed on the structure and the second layer comprising near noble metal is formed on the first layer opposite the silicon substrate 50. The niobium exhibits a large oxidation rate compared to the silicon substrate 50 and the polysilicon gate electrode 54. The near noble metal exhibits a large diffusion coefficient compared to the niobium, the semiconductor substrate 50 and the polysilicon gate electrode 54. The near noble metal is preferably cobalt. The use of niobium can reduce and preferably minimize the consumption of the semiconductor substrate 50 and the polysilicon gate electrode 54.

Rapid thermal annealing is then conducted to thereby selectively form the third layer 61a, 60a comprising a near noble silicide on the source/drain regions 56 and on the polysilicon gate electrode 54 respectively, and to form the fourth layer 61b, 60b comprising niobium-near noble alloy on the third layer on the source/drain regions 56 and on the polysilicon gate electrode 54, respectively.

The niobium layer can remove native oxide from on the polysilicon gate electrode 54 and on the source/drain regions 56, because niobium has a high oxidation rate. Also, the niobium layer can delay diffusion of the cobalt such that planar and thin epitaxial cobalt silicide layers are formed.

Moreover, there may be little or no undesirable reaction that consumes the silicon substrate and polysilicon gate electrode, except for the cobalt silicide forming silicidation reaction. Accordingly, consumption of the silicon substrate can be reduced and preferably minimized, thereby providing shallow source/drain regions 56.

It will also be understood that when annealing is performed in nitrogen at about 800° C. or more for about 30 seconds, niobium nitride layers may be formed on the fourth layer comprising niobium-near noble metal alloy 60b, 61b. The niobium nitride layers can serve as a diffusion barrier between the silicide layers and subsequently formed metal layers. In conclusion, by using niobium in cobalt/niobium double metal structures and processes, consumption of the semiconductor substrate can be reduced and preferably minimized to thereby improve shallow junction characteristics.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit contact structure, comprising:
a first layer comprising a near noble metal silicide on a silicon substrate;
a second layer comprising niobium-near noble metal alloy on the first layer, opposite the silicon substrate; and
a third layer comprising niobium nitride on the second layer, opposite the first layer.

2. An integrated circuit contact structure, comprising:
a first layer comprising a near noble metal silicide on a silicon substrate; and
a second layer comprising niobium-near noble metal alloy on the first layer, opposite the silicon substrate;
wherein the near noble metal is cobalt.

3. An integrated circuit contact structure, comprising:
a first layer comprising a near noble metal silicide on a silicon substrate; and
a second layer comprising niobium-near noble metal alloy on the first layer, opposite the silicon substrate;
wherein the structure is free of a native oxide layer between the silicon substrate and the first layer.

4. An integrated circuit contact structure, comprising:
a first layer comprising a near noble metal silicide on a silicon substrate;
a second layer comprising niobium-near noble metal alloy on the first layer, opposite the silicon substrate; and
a third layer comprising niobium nitride on the second layer, opposite the first layer;
wherein the structure is free of a native oxide layer between the silicon substrate and the first layer.

5. An integrated circuit field effect transistor comprising:
spaced apart source and drain regions in a silicon semiconductor substrate;
an insulated polysilicon gate electrode on the silicon semiconductor substrate, between the spaced apart source and drain regions;
a first layer comprising a near noble metal silicide on the spaced apart source and drain regions and on the polysilicon gate electrode;
a second layer comprising niobium-near noble metal alloy on the first layer, opposite the silicon substrate; and
a third layer comprising niobium nitride on the second layer, opposite the first layer.

6. An integrated circuit field effect transistor comprising:
spaced apart source and drain regions in a silicon semiconductor substrate;
an insulated polysilicon gate electrode on the silicon semiconductor substrate, between the spaced apart source and drain regions;
a first layer comprising a near noble metal silicide on the spaced apart source and drain regions and on the polysilicon gate electrode; and
a second layer comprising niobium-near noble metal alloy on the first layer, opposite the silicon substrate;
wherein the near noble metal is cobalt.

7. An integrated circuit field effect transistor comprising:
spaced apart source and drain regions in a silicon semiconductor substrate;
an insulated polysilicon gate electrode on the silicon semiconductor substrate, between the spaced apart source and drain regions;
a first layer comprising a near noble metal silicide on the spaced apart source and drain regions and on the polysilicon gate electrode; and
a second layer comprising niobium-near noble metal alloy on the first layer, opposite the silicon substrate;
wherein the structure is free of a native oxide layer between the silicon substrate and the first layer.

8. An integrated circuit field effect transistor comprising:
spaced apart source and drain regions in a silicon semiconductor substrate;
an insulated polysilicon gate electrode on the silicon semiconductor substrate, between the spaced apart source and drain regions;
a first layer comprising a near noble metal silicide on the spaced apart source and drain regions and on the polysilicon gate electrode;
a second layer comprising niobium-near noble metal alloy on the first layer, opposite the silicon substrate; and
a third layer comprising niobium nitride on the second layer, opposite the first layer;
wherein the structure is free of a native oxide layer between the silicon substrate and the first layer.

* * * * *